United States Patent
Drofenik et al.

(10) Patent No.: US 10,386,403 B2
(45) Date of Patent: Aug. 20, 2019

(54) FAILURE TOLERANT CAPACITOR DEVICE

(71) Applicant: ABB Schweiz AG, Baden (CH)

(72) Inventors: Uwe Drofenik, Zürich (CH); Caroline Andersson, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/048,807

(22) Filed: Jul. 30, 2018

(65) Prior Publication Data

US 2018/0348285 A1 Dec. 6, 2018

Related U.S. Application Data (63) Continuation of application No. PCT/EP2017/051809, filed on Jan. 27, 2017.

(30) Foreign Application Priority Data

Jan. 29, 2016 (EP) ..................... 16153302

(51) Int. Cl.
*H03K 17/955* (2006.01)
*G01R 31/02* (2006.01)
(Continued)

(52) U.S. Cl.
CPC ......... *G01R 31/028* (2013.01); *H01G 4/1272* (2013.01); *H01G 4/35* (2013.01); *H01L 28/40* (2013.01); *H03K 17/955* (2013.01)

(58) Field of Classification Search
CPC ........ H01G 4/1272; H01G 4/35; H01L 28/40; G01R 31/028; H03K 17/955
(Continued)

(56) References Cited

U.S. PATENT DOCUMENTS 5,770,969 A * 6/1998 Walls ...................... H02H 7/16
                                                        307/129
5,789,964 A * 8/1998 Voldman ............. H01L 27/0248
                                                        327/380

(Continued)

FOREIGN PATENT DOCUMENTS

CN        101258553 A       9/2008
CN        101452926 A       6/2009
(Continued)

OTHER PUBLICATIONS

European Patent Office, International Search Report & Written Opinion issued in corresponding Application No. PCT/EP2017/051809, dated Apr. 5, 2017, 11 pp.

(Continued)

*Primary Examiner* — Dinh T Le
(74) *Attorney, Agent, or Firm* — Taft, Stettinius & Hollister, LLP; J. Bruce Schelkopf (57) ABSTRACT

A failure tolerant capacitor device comprises a plurality of capacitor elements connected in parallel. For each capacitor element, there is a detection element and a connection element. The detection element is adapted for detecting a capacitor voltage across the capacitor element falling below a predefined voltage threshold and/or for detecting a capacitor current through the capacitor element raising above a predefined current threshold and for turning off the connection element when the capacitor voltage is below the predefined voltage threshold and/or the capacitor current is above the predefined current threshold. The connection element is adapted for disconnecting the capacitor element from other ones of the plurality of parallel connected capacitor elements when turned off. The detection element and the connection element each include a transistor.

20 Claims, 3 Drawing Sheets

(51) Int. Cl.
*H01G 4/12* (2006.01)
*H01G 4/35* (2006.01)
*H01L 49/02* (2006.01)

(58) Field of Classification Search
USPC .......................................................... 327/289
See application file for complete search history.

(56) References Cited

U.S. PATENT DOCUMENTS

| | | | |
|---|---|---|---|
| 6,075,378 A * | 6/2000 | Okamura | H02H 7/16 320/122 |
| 6,400,302 B1 | 6/2002 | Amazeen et al. | |
| 6,677,637 B2 | 1/2004 | Bernstein et al. | |
| 7,741,981 B1 | 6/2010 | Wan et al. | |
| 8,064,212 B2 | 11/2011 | Motegi et al. | |
| 8,410,910 B2 | 4/2013 | Naura et al. | |
| 2009/0086457 A1 | 4/2009 | Motegi et al. | |
| 2011/0019321 A1 | 1/2011 | Chen et al. | |
| 2011/0069425 A1 | 3/2011 | Hsu et al. | |

FOREIGN PATENT DOCUMENTS

| | | |
|---|---|---|
| CN | 204481464 U | 7/2015 |
| GB | 2487368 A | 7/2012 |
| GB | 2487495 A | 7/2012 |
| JP | S54149954 A | 11/1979 |
| JP | S55162628 A | 12/1980 |

OTHER PUBLICATIONS

European Patent Office, Extended Search Report issued in corresponding Application No. 16153302.1, dated Jul. 14, 2016, 6 pp.

Marxgut et al., "Interleaved Triangular Current Mode (TCM) Resonant Transition, Single Phase PFC Rectifier with High Efficiency and High Power Density," Proceedings of the IEEE/IEEJ International Power Electronics Conference, ECCE Asia 2010, Sapporo, Japan, Jun. 21-24, 2010, pp. 1725-1732.

"Solution Guides, Flex Crack Countermeasures in MLCCs Outline" TDK Corporation, Multilayer Ceramic Chip Capacitors, Retrieved from https://product.tdk.com/info/en/products/capacitor/ceramic/mlcc/technote/solution/mlcc02/index.html.

"GRM31MR71H105KA88L—Ceramic Capacitor 1 uF 50 VDC 1206, Murata," Distrelec, Online Product Page, Retrieved from http://www.distrelec.ch/en/capacitor-uf-50-vdc-1206-muratagrm31mr71h105ka88l/p/16572110?q=*&filter_Category3=Capacitors&filter_Category4=Ceramic+Capacitors&filter_Rated+voltage=50+VDC&filter_Capacitance=1+%C2%B5F&filter_Buyable=1&page=5&origPageSize=25&simi=99.8.

"SMD Multilayer Caramic Capacitors," Distrelec, Online Product Page, Retrieved from http://www.distrelec.ch/en.

"2N7000/2N7002/NDS7002A N-Channel Enhancement Mode Field Effect Transistor," Fairchild Semiconductor, Product Brochure, Retrieved from https://www.distrelec.ch/Web/Downloads/_t/ds/2n7000_eng_tds.pdf?mime=application%2Fpdf.

* cited by examiner

FAILURE TOLERANT CAPACITOR DEVICE

FIELD OF THE INVENTION

The invention relates to a failure tolerant capacitor device, a failure monitoring system, a gate driver circuit board and a DC link circuit board.

BACKGROUND OF THE INVENTION

In all kinds of electronic hardware, capacitors are employed to store energy, for example, for stabilizing DC voltage levels or for filtering. A special kind of capacitors are multi-layer ceramic capacitors, which may be surface mounted onto printed circuit boards.

Multi-layer ceramic capacitors may have a higher reliability and may tolerate higher ambient temperatures than electrolytic capacitors and thus may be employed in high demanding applications, such as gate drivers of power converters.

In order to increase the capacitance, a large number of ceramic capacitors may be connected in parallel. The realization of large capacitance by paralleling surface mounted ceramic capacitors on printed circuit boards may be limited by the reliability of the assembly: Large ceramic capacitors tend to develop cracks much easier (e.g. during the manufacturing process and the assembly process), and the larger the number of parallel capacitors, the larger the statistical probability that at least one capacitor has a failure. A single capacitor failing into electrical short-mode is usually sufficient to disable the whole electronic assembly.

However, small cracks in ceramic capacitors may initially not be detected. After a while, for example after delivery, the crack may turn from an open connection into an electrical short resulting in failure. It may be that all parallel capacitors are shorted, the voltage at this point of the circuit may drop to zero, and the whole system comprising the electronic assembly (such as a power converter) may stop working.

For example in US 2009/0086457 A1, a ceramic capacitor is protected from cracking by covering it with a soft resin.

GB 2 487 495 A shows a capacitor bank with several capacitors, which may be disconnected from the capacitor bank with a sense/control circuit. The sense/control circuit 106 comprises a MOSFET for disconnecting the capacitor.

US 2011/069425 A1 shows an array of stacked capacitors, which are grouped into groups that may be disconnected from the array via a switching device. The switching device comprises two p-type FETs connected in parallel with respect to each other and in series with a capacitor. A sensor unit composed of several inverters provides a voltage to the gate of one of the FETs, which voltage depends on the leakage current though the capacitor.

DESCRIPTION OF THE INVENTION

It is an objective of the invention to provide electronic assemblies comprising a plurality of paralleled capacitors, which are more reliable and which are easier to maintain.

This objective is achieved by the subject-matter of the independent claims. Further exemplary embodiments are evident from the dependent claims and the following description.

A first aspect of the invention relates to a capacitor device that may be failure tolerant. A capacity device may be an electronic circuit comprising a plurality of capacitors connected in parallel. The capacitors may be mechanically and/or electrically connected to a circuit board. A failure tolerant capacitor device may be a device, which does not stop working completely, even when one or more of the capacitors are defect.

For example, the capacitor device may be a gate driver of a converter, in which the paralleled capacitors provide energy and stabilize a voltage. Also, the capacitor device may be a DC link, in which the paralleled capacitors store energy.

According to an embodiment of the invention, the capacitor device comprises a plurality of capacitor elements connected in parallel; and, for each capacitor element, a detection element and a connection element. The detection element may be adapted for detecting a capacitor voltage across the capacitor falling below a predefined voltage threshold and/or for detecting a capacitor current through the capacitor element raising above a predefined current threshold. Furthermore, the detection element is adapted for turning off the connection element, when the capacitor voltage is below the predefined voltage threshold and/or the capacitor current is above the predefined current threshold. The connection element may be adapted for disconnecting the capacitor element from other one of the plurality of parallel connected capacitor elements (in particular from all of the other capacitor elements), when turned off.

It has to be noted that a capacitor element may comprise one or more capacitors (i.e. single members), which may be connected in parallel. The one or more capacitors may be surface mounted ceramics capacitors. According to an embodiment of the invention, each capacitor element comprises at least two capacitors. According to an embodiment of the invention, the capacitors are (multilayer) ceramics capacitors. According to an embodiment of the invention, the capacitors are surface mounted capacitors.

Each capacitor element may be associated with a detection element and a connection element. When the detection element detects that the respective capacitor element has failed (i.e. a voltage across it has dripped to a very small value or even zero or it has a low resistance, there is a characteristic current through it), the detection element deactivates (turns off) the respective connection element, and disconnects the respective capacitor element from the other ones.

The capacitor elements may be connected in parallel to a voltage source, which may be a power supply of the capacitor device, and the connection element may disconnect the respective capacitor element from the voltage source.

A signal from the detection elements, which is used for triggering the connection element, also may be used as monitoring signal, which additionally also may be sent to a monitoring system, such as a controller.

The detection element and the connection element may be seen as a mechanism which disconnects capacitors which are failing into short mode, and which may report the failure (therefore, providing monitoring of capacitor failures). Removing just the failed capacitor may allow to keep the capacitor device operating with reduced capacitance (since the remaining paralleled capacitors are still working). This, for example, may allow to scale up capacitance by paralleling ceramic capacitors on printed circuit boards, because the general limitation given by reliability is significantly relaxed.

When a capacitor element or one of its capacitors fails, this usually may result in a zero or very small resistance of the capacitor element. In this case, a voltage drop at the capacitor element, i.e. a capacitor voltage across the capacitor element, will become small or zero. Due to a predefined voltage threshold for the voltage drop and/or the capacitor voltage, it is possible to disconnect the failed capacitor element, even if a crack is not (yet) a full short but only provides a low ohmic resistance.

Furthermore, due to the small resistance a rather high current though the capacitor element may be detected. Alternatively or additionally, the current may be measured and compared with the current threshold. In the case of a too high capacitor current, the failed capacitor element may be disconnected.

In general, the capacitor device may provide prognostics and monitoring of failures of ceramic capacitors. It may provide automatic disconnection of faulty capacitors which allows continued system operation (at reduced capacitance) and therefore a higher reliability. It may provide a possibility to replace larger electrolytic capacitors by paralleled ceramic capacitors. The capacitor device may withstand higher ambient temperatures since it is possible to replace electrolytic capacitors with ceramics capacitors (which may result in lower cooling effort and higher power density, especially for applications with protected enclosures for harsh environment).

According to an embodiment of the invention, the detection element is adapted for turning on the connection element, wherein the connection element is adapted for connecting the capacitor element to the voltage source, when turned on. During start-up of the device and/or when the capacitor is completely discharged, it may be that the capacitor voltage is zero, although the capacitor element has not failed. In this case, the detection element may have turned off the connection element. When the capacitor element should be charged, it may be tested, whether it is failed or not, by turning the connection element on, and then, when the capacitor voltage raises above the predefined voltage threshold and/or the capacitor current stays below the predefined current threshold, not turning off the connection element. In such a way, it may be detected if the capacitor element is really shorted or just without charge (at zero voltage).

As described below, the detection element may comprise one single transistor and/or the connection element may comprise one single transistor. In such a way, the capacitor device may be of low complexity, reliable and economical.

According to an embodiment of the invention, the detection element comprises a (single) detection transistor, which is connected with the capacitor element in such a way that the detection transistor is switched into a blocking state, when the capacitor voltage falls below the predefined voltage threshold and/or when the capacitor current raises above the predefined current threshold.

The detection transistor may be a bipolar transistor. In this case, the detection transistor may be connected with its base and its emitter across the capacitor element.

The detection transistor may be a MOSFET transistor. In this case, the detection transistor may be connected with its gate and its source across the capacitor element.

When the voltage across the capacitor element falls below the predefined voltage threshold and/or when the current through the capacitor element raises above the predefined current threshold, the detection transistor may become blocking and may trigger the connection element in this way.

According to an embodiment of the invention, the capacitor device further comprises a resistive element connected in parallel to the detection transistor. This resistive element may bypass the blocking detection transistor and may trigger the connection element for testing, whether the capacitor is discharged or failed.

According to an embodiment of the invention, the capacitor device further comprises a resistive element connected in series with the detection transistor. Such a resistive element may constitute a voltage divider together with the detection transistor and may be used for adjusting the voltage level of the gate or base voltage of the detection transistor, i.e. for adjusting the predefined voltage threshold and/or the predefined current threshold, at which the detection element switches. Furthermore, such a resistive element may be used for adjusting a voltage level of the signal provided to the connection element.

According to an embodiment of the invention, the capacitor device further comprises a resistive element connected between a control input (i.e. gate or base) of the detection transistor and the capacitor element. Such a resistive element may constitute a voltage divider together with the detection transistor and may be used for adjusting the voltage level of the gate or base voltage of the detection transistor, i.e. for adjusting the predefined voltage threshold and/or predefined current threshold, at which the detection element switches.

It has to be noted that the resistive elements may be resistors and/or semiconductor elements. For example, the resistive elements may comprise a further transistor and/or may comprise a diode, such as a Zener diode.

According to an embodiment of the invention, the connection element comprises a (single) connection transistor connected in series with the capacitor element, which connection transistor is switched into a blocking state, when turned off by the detection element.

The connection transistor may be a bipolar transistor. In this case, the connection transistor may be connected with its collector to the capacitor element. The base of the connection transistor may be triggered with a signal from the detection element.

The connection transistor may be a MOSFET transistor. In this case, the connection transistor may be connected with its drain to the capacitor element. The gate of the connection transistor may be triggered with a signal from the detection element.

According to the invention, the detection element comprises a bipolar detection transistor and the connection element comprises a bipolar connection transistor, wherein the connection transistor is connected in series with the capacitor element, such that a collector of the connection transistor is connected with the capacitor element, wherein a base of the detection transistor is connected to the collector of the connection transistor and wherein a base of the connection transistor is connected to a collector of the detection transistor.

Employing bipolar transistors as detection and connection transistor may allow disconnecting the capacitor element also in case the failure is in form of a low ohmic resistance in parallel to some remaining capacitance without the usage of highly adjusted resistances.

According to an embodiment of the invention, the detection transistor is an npn-transistor and the connection transistor is a pnp-transistor or the detection transistor is a pnp-transistor and the connection transistor is an non-transistor.

According to an embodiment of the invention, a diode is connected antiparallel to the connection transistor. This diode may allow to bypass a bipolar connection transistor, which is always blocking in one direction between emitter and collector.

According to the invention, the detection element comprises a MOSFET detection transistor and the connection element comprises a MOSFET connection transistor, wherein the connection transistor is connected in series with the capacitor element, such that a drain of the connection transistor is connected with the capacitor element, wherein a gate of the detection transistor is connected to the drain of the connection transistor, and wherein a gate of the connection transistor is connected to a drain of the detection transistor.

For adjusting the threshold(s) for disconnecting the capacitor element also in case, the failure is in form of a low ohmic resistance in parallel to some remaining capacitance, adjusted resistances in series with the detection transistor may have to be used. A realization with MOSFET transistors may show lower output voltage ripple. Furthermore, no additional diode may have to be used, which would provide a voltage drop.

According to an embodiment of the invention, the detection transistor is an N-channel MOSFET and the connection transistor is a P-channel MOSFET or the detection transistor is a P-channel MOSFET and the connection transistor is an N-channel MOSFET.

In general, independent of MOSFET and bipolar transistors, the detection transistor and the connection transistor may have opposite turning on and turning off behaviour provided by their control input.

A further aspect of the invention relates to a failure monitoring system.

According to an embodiment of the invention, the failure monitoring system comprises at least one failure tolerant capacitor device as described in the above and in the following and a controller interconnected with each detection element and adapted for monitoring a failure state of the respective capacitor element.

For example, the controller may be a controller of an electronic device comprising the failure tolerant capacitor device, such as a controller of a converter, which comprises gate drivers designed as failure tolerant capacitor devices.

When a capacitor element fails, this may be reported from the detection element to the controller. The controller may collect this information and, for example, during maintenance a service technician may see, which failure tolerant capacitor device may have to be exchanged.

A further aspect of the invention relates to a gate driver circuit board, which may be a printed circuit board, on which among other electronics elements, such as ICs (like DSPs, FPGA, etc.) for controlling a gate of an electronic switch, a plurality of capacitor elements is assembled.

According to an embodiment of the invention, the gate driver circuit board comprises a gate driver circuit for switching a gate of a high power semiconductor and a failure tolerant capacitor device as described in the above and in the following. The gate driver circuit may receive a switching signal from a superordinated controller (such as a controller of a power converter) and/or may transform the switching signal into a gate signal. The superordinated controller also may be interconnected with the detection elements to constitute failure monitoring system. A high power semiconductor may be a thyristor or transistor, which may be adapted for switching currents of more than 1 A and/or more than 100 V.

According to an embodiment of the invention, a capacitor assembly adapted for providing a gate of the high power semiconductor with current is provided as failure tolerant capacitor device. In other words, the capacitor assembly may be used for storing energy used for switching the high power semiconductor.

According to an embodiment of the invention, a filter capacitor assembly for energy storage and voltage stabilization in the gate drive is provided as failure tolerant capacitor device. For example, an EMI filter of a converter may be provided with a capacitance in the form of a failure tolerant capacitor device.

A further aspect of the invention relates to a DC link circuit board, which may be a printed circuit board, and which comprises a plurality of DC link capacitors, which are provided by a failure tolerant capacitor device as described in the above and in the below.

It has to be understood that features of the capacitor device as described in the above and in the following may be features of the failure monitoring system, the gate driver circuit board and/or the DC link circuit board as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
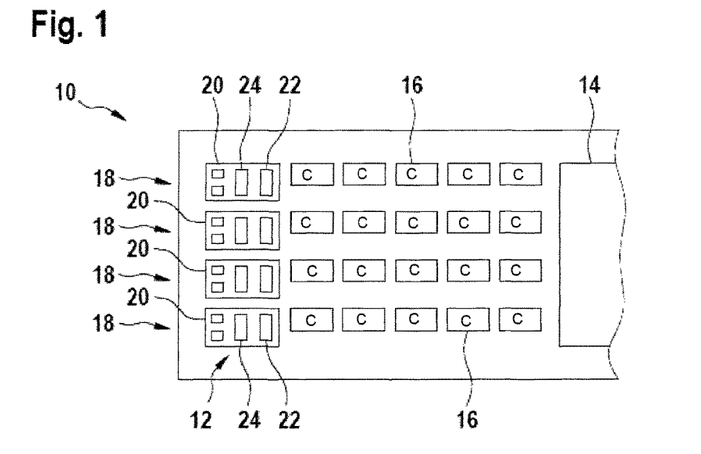
FIG. 1 schematically shows a printed circuit board according to an embodiment of the invention.

FIG. 1 shows a circuit board 10 comprising a failure tolerant capacitor device 12.

The circuit board 10 may be a printed circuit board may be a gate driver circuit board, which comprises a plurality of electronic elements 14, such as DSPs, FPGAs, transistors, etc. adapted for receiving a switching signal and for transforming the switching signal into a gate signal adapted for triggering a power semiconductor, such as a thyristor or transistor.

For example, the capacitor device 12 may provide an output capacitance for the gate driver circuit provided by the circuit board 10. It also may be possible that the capacitor device 12 provides a filter capacitance for the gate driver circuit. Furthermore, it may be possible that the circuit board 10 comprises more than one capacitor device 12.

The gate driver circuit board 10 may be part of a power converter, which may comprise a large number of power semiconductors and corresponding gate driver circuit boards.

Alternatively the circuit board 10 may be a DC link circuit board, and may comprise DC link capacitors provided by the failure tolerant capacitor device 12.

The capacitor device 12 may comprise a plurality of individual capacitors 16 connected in parallel. Each of the capacitors 16 may be a surface mounted ceramics capacitor. The capacitors 16 are grouped into groups or capacitor elements 18, wherein each capacitor element 18 is associated to a detection and disconnection circuit 20.

In general, each capacitor element 18 may comprise one or more capacitors 16 connected in parallel, which may be disconnected from the other capacitor elements 18 by the detection and disconnection circuit 20. Each detection and disconnection circuit 20 comprises a detection element 22 for detecting a capacitor failure in the corresponding capacitor element 18 and a connection element 24 that is triggered by the detection element 22 and then disconnects the capacitor element 18 from the other ones.

It may be possible that each capacitor 16 has a detection and disconnection circuit 20 of its own. However, with the capacitor elements 18 formed of groups of capacitors, which as a whole may be disconnected in case a single capacitor 16 of the group fails, cost and/or space may be saved.

Figure 2:
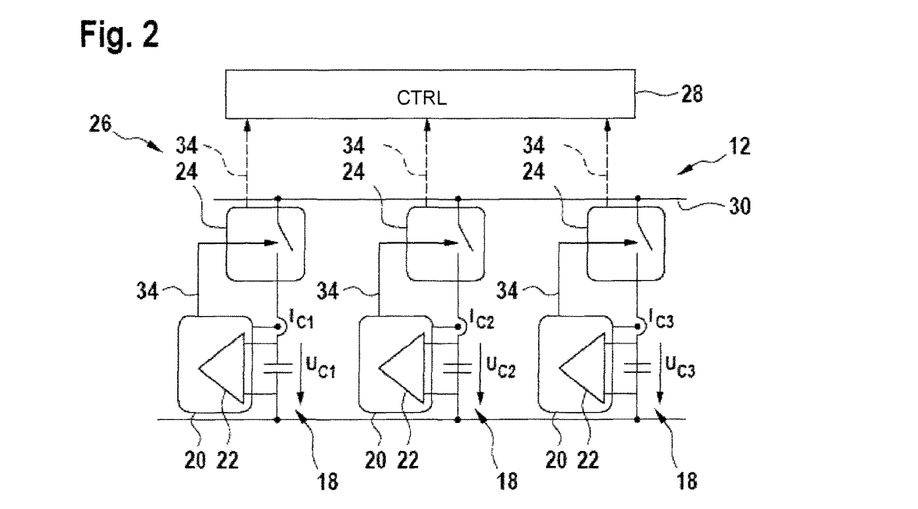
FIG. 2 schematically shows a monitoring system according to an embodiment of the invention.

FIG. 2 shows a failure monitoring system 26, which comprises a capacitor device 12 and a controller 28, which may receive failure signals from the detection and disconnection circuits 20 of the capacitor device 12. The controller 28 may be a controller of an electric device comprising the capacitor device 12, such as a converter controller of a converter comprising a plurality of power semiconductors switched by a plurality of gate driver circuit boards as shown in FIG. 1.

Each of the capacitor elements 18 (which may comprise parallel connected capacitors 16) are connected in series with a switch of the respective connection element 24 and are all connected in parallel between a positive line 30 and a negative line 32 of a voltage source.

Each detection element 22 may measure and/or detect a voltage $U_{C1}$, $U_{C2}$, $U_{C3}$ across the respective capacitor element 18 and may compare it with a voltage threshold (which may be zero or nearly zero). Additionally or alternately, each detection element 22 may measure and/or detect a current $i_{C1}$, $i_{C2}$, $i_{C3}$ through the respective capacitor element 18 and may compare it with a current threshold.

In the case, a capacitor 16 of the capacitor elements 18 fails, a resistance of the capacitor 16 and therefore of the capacitor element 18 becomes low or nearly zero. The voltage across the capacitor element drops below the voltage threshold and/or the current through the capacitor element raises above the current threshold.

Then the detection element 22 generates a failure signal 34, which triggers the connection element 24, which then is turned off and opens its switch. Thus, in the case of a short or low ohmic resistance of the capacitor element 18, the switch disconnects the faulty capacitor element 18 and the remaining capacitor elements 18 may continue to operate. The remaining capacitance of the capacitor device 12 is reduced accordingly, but the overall system may remain functional.

The failure signal 34 also may be transmitted to the controller 28, which may monitor the failure states of all capacitor elements 18 and the capacitor devices 12. Such a monitoring may allow feedback for design improvement and/or better maintenance service.

Figure 3:
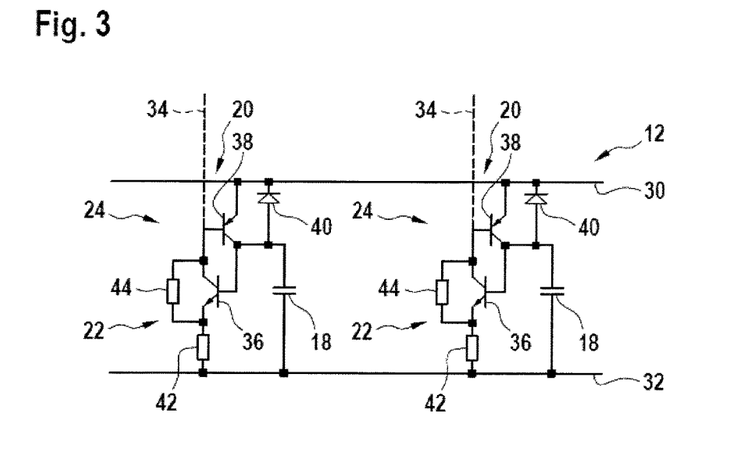
FIG. 3 shows a circuit diagram for a capacitor device according to an embodiment of the invention.
Figure 4:
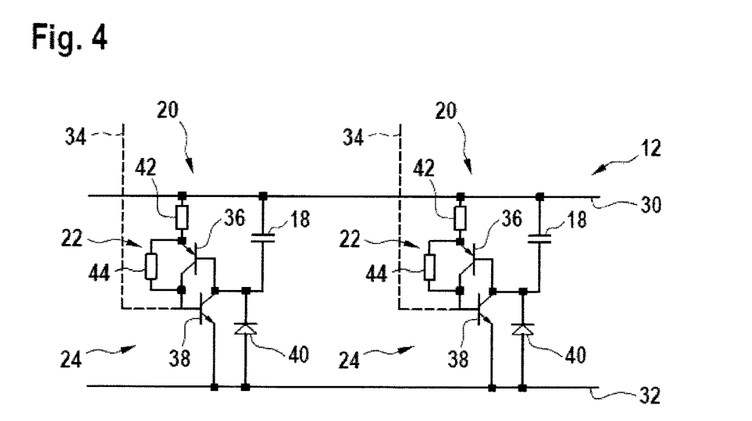
FIG. 4 shows a circuit diagram for a capacitor device according to a further embodiment of the invention.

FIGS. 3 and 4 show capacitor devices 12, which are realized with a detection and disconnection circuits 20 based on bipolar transistors. The detection element 22 of each circuit 20 comprises a single detection transistor 36 and the connection element 24 comprises a single connection transistor 38.

The connection transistor 38 is connected in series with the capacitor element 18 and is connected with its collector to the capacitor element 18, which on the other side is connected to the negative line 32. With its emitter, the connection transistor is connected to the positive line 30. Since the connection transistor 38 is a bipolar transistor, always blocking in direction from its collector to its emitter, a diode 40 is connected antiparallel to its collector and emitter.

The detection transistor 36 is connected with its emitter and base across the capacitor element 18, i.e. with its emitter to the negative line 32 and with its base to the collector of the connection transistor 38. With its collector, the detection transistor 36 is connected to the base of the connection transistor 38.

Under the assumption that the connection transistor 38 is in a conducting state and that the lines 30, 32 provide a positive voltage, the capacitor element 18, when not failed, is charged and a capacitor voltage higher than a voltage threshold is provided between the base and the emitter of the detection transistor 36. The detection transistor 36 is conducting, the base of the connection transistor is connected to the negative line 32 and also the connection transistor stays conducting.

When, for example in case of a failure, the voltage across the capacitor element 18 drops below a specific value, which may be adjusted with the resistor 42 connected between the emitter of the detection transistor 36 and the negative line 32, the detection transistor 36 and the connection transistor 38 switches into a blocking state.

Also, in case of a failure, where the crack in capacitor element 18 is not fully conducting, but the current through capacitor element 18 and connection transistor 38 is already large, the base current of connection transistor 38, which is the emitter-collector-current of detection transistor 36, is increased, too, which results in an increased voltage drop across resistor 42. This increased voltage drop reduces the base-emitter voltage of detection transistor 36 which limits the collector-emitter-current through detection transistor 36 and the base-current of connection transistor 38, and, therefore, through connection transistor 38 and the faulty capacitor 18.

The voltage at the base of the connection transistor 40 may be used as signal about the failure state of the capacitor element 18 and, for example, may be connected via a further line with the controller 28.

Since it may be possible that the voltage across the capacitor element 18 is also small or zero in the startup phase of the capacitor device or when the capacitor element 18 is completely discharged, a resistor 44 is connected between the collector and the emitter of the detection transistor 36. The connection transistor 38 may be switched into a conducting state via the resistor 44 and it may be tested, whether the capacitor element 18 starts to develop a voltage across it. If this is the case, as described above, the detection transistor 36 becomes conducting and the connection transistor 38 stays conducting. Otherwise, the detection transistor 36 and the connection transistor 38 becomes blocking. In summary, this may result in a small leakage current through the capacitor element 18, which, however, is substantially smaller than a current through a failed capacitor element 18 without the circuit 20.

The resistors 44, 42 are, dependent on application and transistor parameters, required or optional. The additional resistor 42 may allow higher DC voltages and/or setting the voltage threshold for a fault (short of the capacitor).

The circuit 20 shown in FIG. 3 (and also the following figures) may work without external control and is simple and economical. Furthermore, the circuit 20 is reliable, since a failure of one of the transistors 36, 38 would not result in a short, but in a loss of the functionality of this specific circuit 20. Also, the circuit 20 allows for providing a monitoring signal indicating a failure and/or may detect automatically if the capacitor element 18 is just not charged or really has a short circuit failure.

In FIG. 3, the detection transistor 36 is realized with an npn bipolar transistor, while the connection transistor 38 is realized as pnp bipolar transistor.

FIG. 4 shows a capacitor device 12 analogous to the FIG. 3, where the detection transistor 36 is realized with a pnp bipolar transistor, while the connection transistor 38 is realized as npn bipolar transistor. With respect to FIG. 3, the circuit of FIG. 4 may be seen as mirrored with respect to the positive and the negative lines 30, 32. In FIG. 4, the capacitor element 18 is directly connected to the positive line 30 and connected via the connection transistor 38 (and the diode 40) to the negative line 32. Similarly, the detection transistor 36 is connected via its emitter with the positive line 30.

Figure 5:
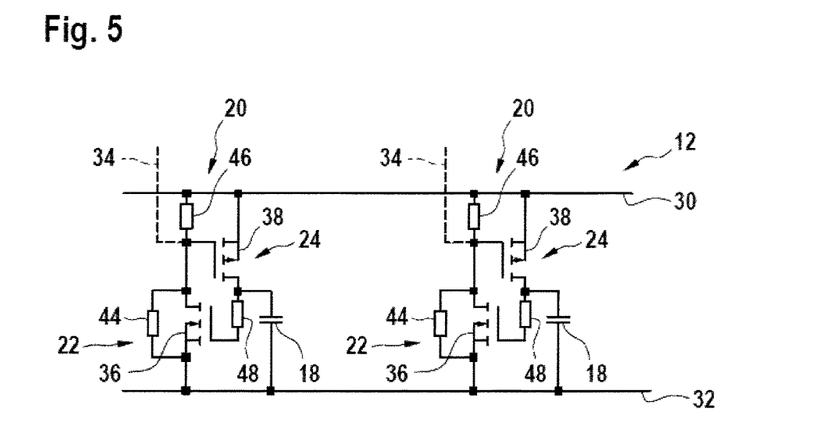
FIG. 5 shows a circuit diagram for a capacitor device according to a further embodiment of the invention.
Figure 6:
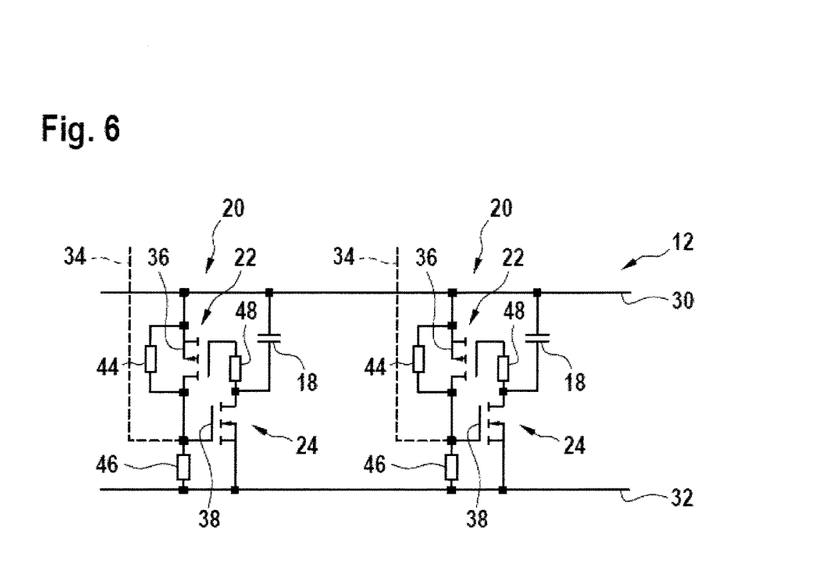
FIG. 6 shows a circuit diagram for a capacitor device according to a further embodiment of the invention.

FIGS. 5 and 6 show circuits analogously to FIGS. 3 and 4 with the bipolar transistors replaced by MOSFET transistors.

In particular, in FIG. 5, the detection transistor 36 is an N-channel MOSFET, while the connection transistor 38 is a P-channel MOSFET. In FIG. 6, the detection transistor 36 is a P-channel MOSFET, while the connection transistor 38 is an N-channel MOSFET.

The functionality of the circuit is mainly the same. However, with respect to the description of FIGS. 3 and 4, the terms for the inputs of the bipolar transistors "base", "emitter" and "collector" have to be replaced by the terms "gate", "source" and "drain".

The resistor 46 together with the detection transistor 36 and/or the resistor 44 forms a voltage divider for the gate of the connection transistor 38, which as MOSFET is now voltage controlled.

The resistor 48 between the drain of the connection transistor 38 and the gate of the detection transistors 36 may allow higher DC voltages and/or setting a voltage threshold for a fault (short of the capacitor). It may be possible that also in the capacitor devices 12 of FIGS. 3 and 4, such a resistor 48 is provided. Furthermore, it is possible that in the capacitor devices 12 of FIGS. 5 and 6, a resistor 42 is provided.

In general, the resistors 42, 44, 46, 48 are optional.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 gate driver circuit board
12 capacitor device
14 electronics element, gate driver circuit
16 capacitor
18 capacitor element
20 detection and disconnection circuit 20
22 detection element
24 connection element
26 failure monitoring system
28 controller
30 positive line
32 negative line
34 failure signal
36 detection transistor
38 connection transistor
40 diode
42 resistor
44 resistor
46 resistor
48 resistor

The invention claimed is:
1. A failure tolerant capacitor device, comprising:
a plurality of capacitor elements connected in parallel; and
a detection element and a connection element for each capacitor element of the plurality of capacitor elements;
wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;
wherein the connection element is adapted for disconnecting the capacitor element from other ones of the plurality of parallel connected capacitor elements, when turned off;
wherein the detection element comprises a bipolar detection transistor and the connection element comprises a bipolar connection transistor;
wherein the connection transistor is connected in series with the capacitor element, such that a collector of the connection transistor is connected with the capacitor element;
wherein a base of the detection transistor is connected to the collector of the connection transistor;
wherein a base of the connection transistor is connected to a collector of the detection transistor.
2. The capacitor device of claim 1,
wherein the detection transistor is an npn-transistor and the connection transistor is a pnp-transistor.
3. The capacitor device of claim 1,
wherein a diode is connected antiparallel to the connection transistor.
4. The capacitor device of claim 1,
wherein the detection transistor is a pnp-transistor and the connection transistor is a nn-transistor.
5. The capacitor device of claim 1, further comprising:
a controller interconnected with each detection element and adapted for monitoring a failure state of the respective capacitor element.
6. A failure tolerant capacitor device, comprising:
a plurality of capacitor elements connected in parallel; and
a detection element and a connection element for each capacitor element of the plurality of capacitor elements;

wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;

wherein the connection element is adapted for disconnecting the capacitor element from other ones of the plurality of parallel connected capacitor elements, when turned off;

wherein the detection element comprises a MOSFET detection transistor and the connection element comprises a MOSFET connection transistor;

wherein the connection transistor is connected in series with the capacitor element, such that a drain of the connection transistor is connected with the capacitor element;

wherein a gate of the detection transistor is connected to the drain of the connection transistor;

wherein a gate of the connection transistor is connected to a drain of the detection transistor.

7. The capacitor device of claim 6,
wherein the detection transistor is an N-channel MOSFET and the connection transistor is a P-channel MOSFET.

8. The capacitor device of claim 6,
wherein the detection element is adapted for turning on the connection element;
wherein the connection element is adapted for connecting the capacitor element to the other capacitor elements, when turned on.

9. The capacitor device of claim 6,
wherein the detection transistor is connected with the capacitor element in such a way that the detection transistor is switched into a blocking state, when at least one of the capacitor voltage falls below the predefined voltage threshold and the capacitor current raises above the predefined current threshold.

10. The capacitor device of claim 6, further comprising at least one of:
a resistive element connected in parallel to the detection transistor;
a resistive element connected in series with the detection transistor; and
a resistive element connected between a control input of the detection transistor and the capacitor element.

11. The capacitor device of claim 6,
wherein the connection transistor is connected in series with the capacitor element, which connection transistor is switched into a blocking state, when turned off by the detection element.

12. The capacitor device of claim 6,
wherein each capacitor element comprises at least two capacitors.

13. The capacitor device of claim 12,
wherein the capacitors are at least one of ceramics capacitors and surface mounted capacitors.

14. The capacitor device of claim 6, further comprising:
a controller interconnected with each detection element and adapted for monitoring a failure state of the respective capacitor element.

15. The capacitor device of claim 6,
wherein the detection transistor is a P-channel MOSFET and the connection transistor is an N-channel MOSFET.

16. A gate driver circuit board, comprising:
a gate driver circuit for switching a gate of a high power semiconductor; and
a failure tolerant capacitor device comprising:
a plurality of capacitor elements connected in parallel; and
a detection element and a connection element for each capacitor element of the plurality of capacitor elements;
wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;
wherein the connection element is adapted for disconnecting the capacitor element from other ones of the plurality of parallel connected capacitor elements, when turned off;
wherein the detection element comprises a bipolar detection transistor and the connection element comprises a bipolar connection transistor;
wherein the connection transistor is connected in series with the capacitor element, such that a collector of the connection transistor is connected with the capacitor element;
wherein a base of the detection transistor is connected to the collector of the connection transistor;
wherein a base of the connection transistor is connected to a collector of the detection transistor.

17. The gate driver circuit board of claim 16,
wherein at least one of an output capacitor assembly adapted for providing a gate of the high power semiconductor with current is provided as failure tolerant capacitor device and a capacitor assembly of a filter of the gate driver circuit is provided as failure tolerant capacitor device.

18. A DC link circuit board, comprising:
a plurality of DC link capacitors provided by a failure tolerant capacitor device, the failure tolerant capacitor device comprising:
a plurality of capacitor elements connected in parallel; and
a detection element and a connection element for each capacitor element of the plurality of capacitor elements;
wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;
wherein the connection element is adapted for disconnecting the capacitor element from other ones of the plurality of parallel connected capacitor elements, when turned off;
wherein the detection element comprises a bipolar detection transistor and the connection element comprises a bipolar connection transistor;

wherein the connection transistor is connected in series with the capacitor element, such that a collector of the connection transistor is connected with the capacitor element;

wherein a base of the detection transistor is connected to the collector of the connection transistor;

wherein a base of the connection transistor is connected to a collector of the detection transistor.

19. A gate driver circuit board, comprising:

a gate driver circuit for switching a gate of a high power semiconductor; and a failure tolerant capacitor device comprising:
   a plurality of capacitor elements connected in parallel; and
   a detection element and a connection element for each capacitor element of the plurality of capacitor elements;
   wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;
   wherein the connection element is adapted for disconnecting the capacitor element from other ones of the plurality of parallel connected capacitor elements, when turned off;
   wherein the detection element comprises a MOSFET detection transistor and the connection element comprises a MOSFET connection transistor;
   wherein the connection transistor is connected in series with the capacitor element, such that a drain of the connection transistor is connected with the capacitor element;
   wherein a gate of the detection transistor is connected to the drain of the connection transistor;
   wherein a gate of the connection transistor is connected to a drain of the detection transistor.

20. A DC link circuit board, comprising:

a plurality of DC link capacitors provided by a failure tolerant capacitor device, the failure tolerant capacitor device comprising:
   a plurality of capacitor elements connected in parallel; and
   a detection element and a connection element for each capacitor element of the plurality of capacitor elements;
   wherein the detection element is adapted for at least one of detecting a capacitor voltage across the capacitor element falling below a predefined voltage threshold and detecting a capacitor current through the capacitor element raising above a predefined current threshold and for turning off the connection element, when at least one of the capacitor voltage is below the predefined voltage threshold and the capacitor current is above the predefined current threshold;
   wherein the connection element is adapted for disconnecting the capacitor element from other ones of the plurality of parallel connected capacitor elements, when turned off;
   wherein the detection element comprises a MOSFET detection transistor and the connection element comprises a MOSFET connection transistor;
   wherein the connection transistor is connected in series with the capacitor element, such that a drain of the connection transistor is connected with the capacitor element;
   wherein a gate of the detection transistor is connected to the drain of the connection transistor;
   wherein a gate of the connection transistor is connected to a drain of the detection transistor.

\* \* \* \* \*